United States Patent [19]

Shum

[11] 4,257,056
[45] Mar. 17, 1981

[54] ELECTRICALLY ERASABLE READ ONLY MEMORY

[75] Inventor: Ying K. Shum, Cupertino, Calif.

[73] Assignee: National Semiconductor Corporation, Santa Clara, Calif.

[21] Appl. No.: 52,595

[22] Filed: Jun. 27, 1979

[51] Int. Cl.³ .................... H01L 29/78; H01L 29/34; H01L 29/04; G11C 11/34
[52] U.S. Cl. ........................ 357/23; 357/54; 357/59; 357/65; 365/185
[58] Field of Search ................... 357/23, 41, 54, 59

[56] References Cited

U.S. PATENT DOCUMENTS

| | | | |
|---|---|---|---|
| 3,984,822 | 10/1967 | Simko et al. | 357/23 |
| 4,004,159 | 1/1977 | Rai et al. | 357/54 |
| 4,019,197 | 4/1977 | Lohstroh et al. | 357/23 |
| 4,087,795 | 5/1978 | Rossler | 357/23 |
| 4,115,914 | 9/1978 | Harari | 357/54 |

OTHER PUBLICATIONS

Dimaria et al., "Interface Effects and High Conductivity in Oxides Grown from Polycrystalline Silicon", Applied Physics Letters, vol. 27, (11/75), pp. 505–507.
Kahng et al., "A Floating Gate and Its Application to Memory Devices", Bell System Tech. Journal, (7-8/67), pp. 1288–1295.
Rossler et al., "Erasable and Electrically Reprogrammable Read—Only Memory Using the N—Channel One—Transistor Cell", Siemens Forsch.—U Entwickl,—Ber. Bd. (1975), Nr. 6, pp. 345–351.
Barnes et al., "Operation and Characterization of N— Channel EPROM Cells", Solid—State Electronics, vol. 21, (1978), pp. 521–529.
Scheibe et al., "Technology of a New N—Channel One—Transistor EAROM Cell Called SIMOS", IEEE Trans. Electron Devices, vol. ED-24, (5/77), pp. 600–610.

Primary Examiner—Gene M. Munson
Attorney, Agent, or Firm—Gail W. Woodward; James A. Sheridan

[57] ABSTRACT

An electrically erasable floating gate storage cell (EPROM) is disclosed which comprises a body of single crystal silicon semiconductor material having a substrate of one conductivity type, a source region and a drain region each of a second conductivity type, a channel region of the first conductivity type connecting the source region and drain region, a polycrystalline silicon layer conductively connected to either the source region or the drain region, a conductive insulated floating gate which partially overlies and is separated from the polycrystalline silicon layer by a layer of silicon dioxide and a control gate which overlies and is separated from the floating gate by a layer of silicon dioxide. Fowler-Nordheim tunneling current occurs between the polycrystalline layer and the floating gate during programming and erasing of the EPROM. The floating gate influences the conductivity of the channel region in accordance with the charge stored thereon during programming. The control gate is oriented over the entire channel region to control the conductivity of the channel region in accordance with voltages applied thereto during operation of the EPROM.

13 Claims, 5 Drawing Figures

ELECTRICALLY ERASABLE READ ONLY MEMORY

BACKGROUND OF THE INVENTION

1. Field of the Invention

This invention relates to electrically erasable programmable read-only memories.

2. Description of the Prior Art

Kahng and Sze in the Bell Systems Technical Journal for July and August of 1967, pages 1288-1295 describe an EPROM cell. This cell employs a sandwich structure comprising in successive layers, a p type channel formed in an n type substrate, a first insulation layer, a metal floating gate, a second insulation layer and a metal control gate. When the first insulation layer is sufficiently thin or small and a positive bias is applied to the control gate with respect to a source region, the mechanism of tunneling or internal tunnel-hopping causes an electron accumulation on the floating gate.

EPROM cells are also described in (1) Siemens Forsch.-U. Entwickl.-Ber. Bd. (1975) Nr. 6, pages 345-351, in an article entitled "Erasable and Electrically Reprogrammable Read-Only Memory Using the N-Channel SIMOS One Transistor Cell," by authors B. Rossler and R. G. Muller; (2) Solid-State Electronics, Vol. 21, pp. 521-529, 1978 in an article entitled "Operation and Characterization of N. Channel EPROM Cells," by author J. Barnes, and (3) IEEE Transactions on Electronic Devices Vol. ED-24 No. 5, pp. 600-610, May, 1977 in an article entitled "Technology of a New N-Channel One-Transistor EAROM Cell Called SIMOS," by authors A. Scherbe and H. Schulte. This EPROM cell is illustrated in detail infra in FIGS. 1-3.

Other examples of EPROM cells are described in U.S. Pat. No. 3,984,822 and No. 4,019,197.

SUMMARY OF THE INVENTION

The present invention comprises a floating gate EPROM cell having a polycrystalline silicon layer disposed in conductive contact with a source region or a drain region of the EPROM cell, a floating gate which partially overlies and is insulated from the polycrystalline silicon layer by a layer of silicon dioxide and a control gate which overlies and is insulated from the floating gate by a layer of silicon dioxide. Both the floating gate and the control gate have portions overlying and closely spaced from the channel to influence the conductivity of the channel. The polycrystalline silicon layer increases the Fowler-Nordheim tunneling current which occurs through the silicon dioxide between the floating gate and the polycrystalline silicon layer during programming and erasing of the cell.

The increasing of the Fowler-Nordheim tunneling current in an EPROM during programming and erasing has two advantages. The increased Fowler-Nordhiem current decreases the magnitude of the electric field required to program or erase the cell. The increased Fowler-Nordheim current also permits the decrease of the time interval required to program or erase the cell.

DESCRIPTION OF THE DRAWINGS

The invention will be more fully apparent from the following detailed description when read in connection with the accompanying drawing in which.

PREFERRED EMBODIMENT

Figure 1:
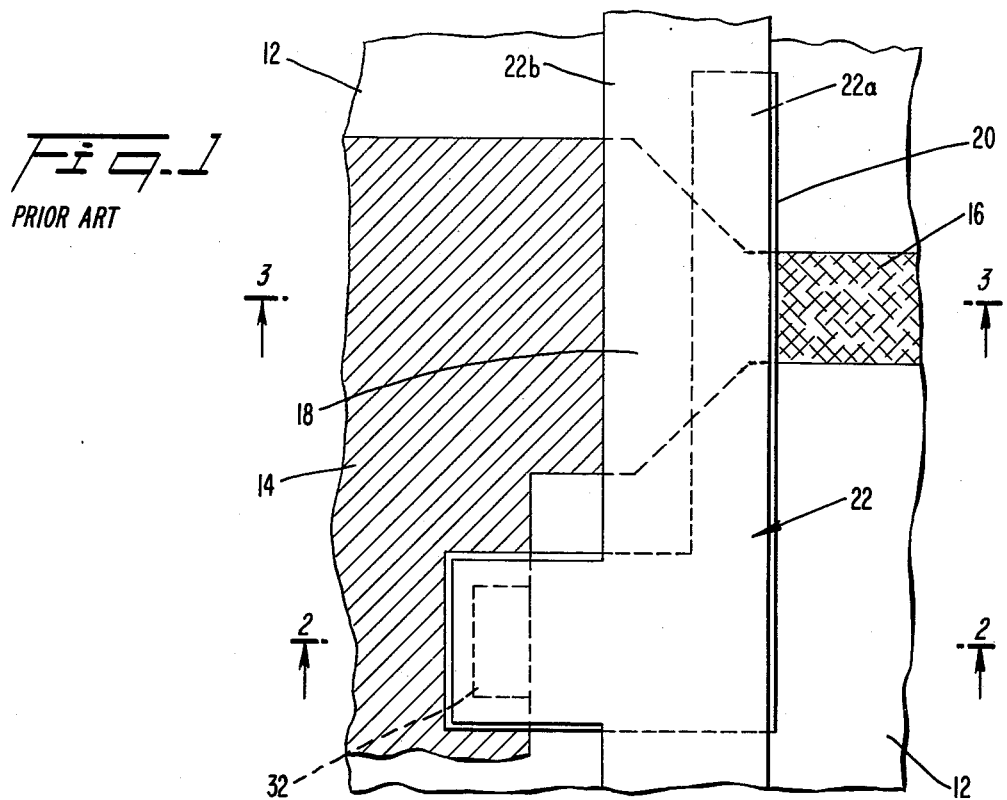
FIG. 1 is a top view of a prior art device.
Figure 2:
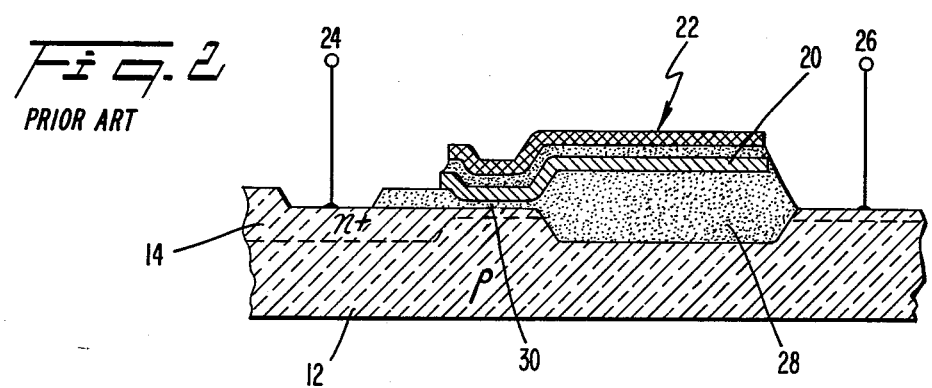
FIG. 2 is a sectional view along line 2—2 of the device of FIG. 1.
Figure 3:
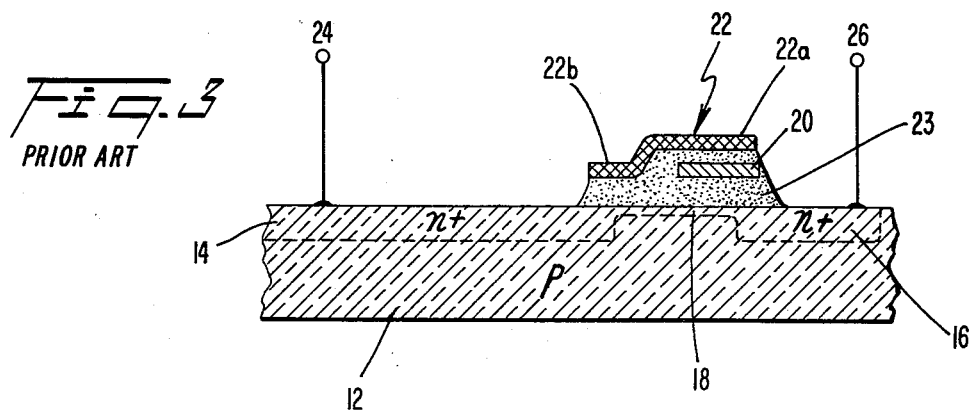
FIG. 3 is a sectional view along the line 3—3 of the device of FIG. 1.

FIGS. 1-3 illustrate the EPROM cell described in the IEEE publication referred to in the description of the prior art.

The EPROM of FIGS. 1-3 is integrated on a semiconductor substrate 12 of p type conductivity on which are provided an n type source region 14, an n type drain region 16 and an p type channel region 18, a polycrystalline silicon floating gate 20 and a polycrystalline silicon control gate 22. A source terminal 24 and a drain terminal 26 are respectively connected to the source region 14 and drain region 16. With reference to FIG. 3, a layer of insulation of silicon dioxide 23 is grown over the channel region 18 which overlaps part of the source region 14 and drain region 16 due to lateral diffusion of the n+ doping. The polycrystalline silicon floating gate 20 overlies part of the channel region 18. The polycrystalline silicon control gate 22 overlies the entire channel region. A first portion 22a overlies the floating gate 20. A second portion 22b overlies the channel 18 and part of the source region 14. The conventional control gate terminal has been omitted from FIGS. 1-3.

FIG. 2 illustrates a cross section of the structure used for electrically erasing the charge which is stored on the floating gate 20 after programming of the cell. A layer of relatively thick silicon dioxide insulation 28 insulates the floating gate 20 from the substrate 12. A layer of relatively thin oxide 30 is disposed between the floating gate 20 and the source diffusion 14 which permits Fowler-Nordheim tunneling current between the floating gate 20 and the source region 14 during erasure. The layer of thin oxide 30 defines the area 32 (FIG. 1) of the floating gate 20 which is active in the erasure of the charge stored on the floating gate after programming.

FIG. 3 illustrates a cross section of the structure used for programming the cell during which electrons are stored on the floating gate 20. The programming of the cell is accomplished primarily by the injection of "hot" electrons which have been accelerated with sufficient kinetic energy to surmount the barrier between the channel region 18 and the floating gate 20.

Programming of the prior art EPROM of FIGS. 1-3 is accomplished by a sequence of steps. A positive voltage such as 25 volts is applied to the control gate 22 relative to the source region 14. A positive voltage such as 16 volts is applied to the drain 16 relative to the source region 14. The positive drain to source voltage in combination with the positive control gate voltage relative to the source causes the EPROM cell to operate in the saturation mode of operation. In this mode of operation, conduction electrons within the channel region 18 will pick up kinetic energy under the acceleration of the electric field that exists in the pinch-off region. Some of these electrons will accumulate enough energy to surmount the potential barrier between the channel region 18 and the silicon dioxide 23 and inject onto the floating gate 20. When the positive programming voltages are removed from the drain region 16 and the control gate 22, as described above, electrons remain trapped on the floating gate 20 because the insulation layer 23 and insulation between the floating gate 20 and control gate 22 prevents their leakage. When a moderate voltage, such as plus 5 volts relative to the source region 14, is applied to the control gate electrode 22 and a positive voltage such as two volts relative to the source is applied to the drain, the trapped electrons on the control gate prevent the inversion of channel 18 so that there is substantially no current flow between the source region 14 and drain region 16. If there was substantially no charge stored on the floating gate 20, the application of a positive voltage to the control gate 22 produces an electric field of a sufficient magnitude to invert the channel region 18 to cause a substantial current flow through the channel region between the source region 14 and the drain region 16.

Erasure, i.e., the removal of the trapped charge on floating gate 20, is accomplished by the following steps. A substantial positive erasure voltage, such as 48 volts is applied to the source region 14 relative to the control gate 22. The resultant electric field between the control gate 20 and the source region 14 at the region 32 of the relatively thin silicon dioxide layer 30 causes Fowler-Nordheim tunneling current to flow between the floating gate 20 and the source region 14 which discharges the floating gate.

The substantial erasure voltage that is required can cause uncontrolled junction avalanche that alters erasure characteristics by causing a positive charge to accumulate in the thin oxide 30, which cause long term device reliability problems.

Lower charging voltages would tend to lessen uncontrolled junction avalanche and promote long term stable device characteristics.

Figure 4:
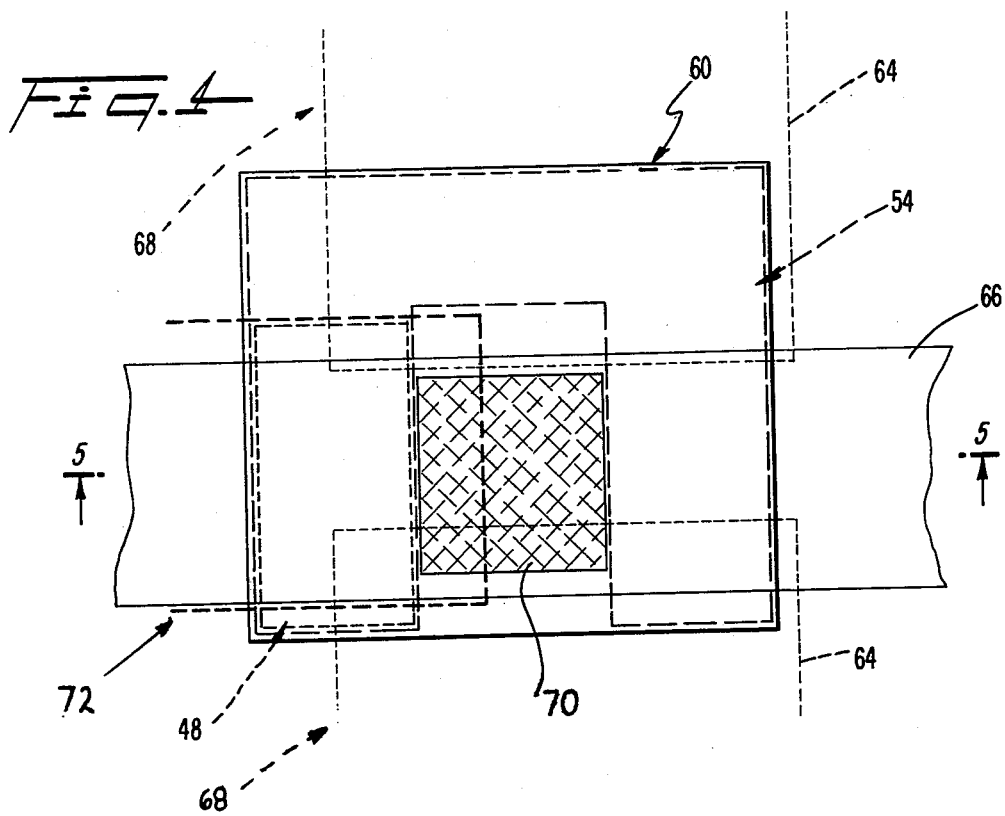
FIG. 4 is a top view of a cell in accordance with the invention.
Figure 5:
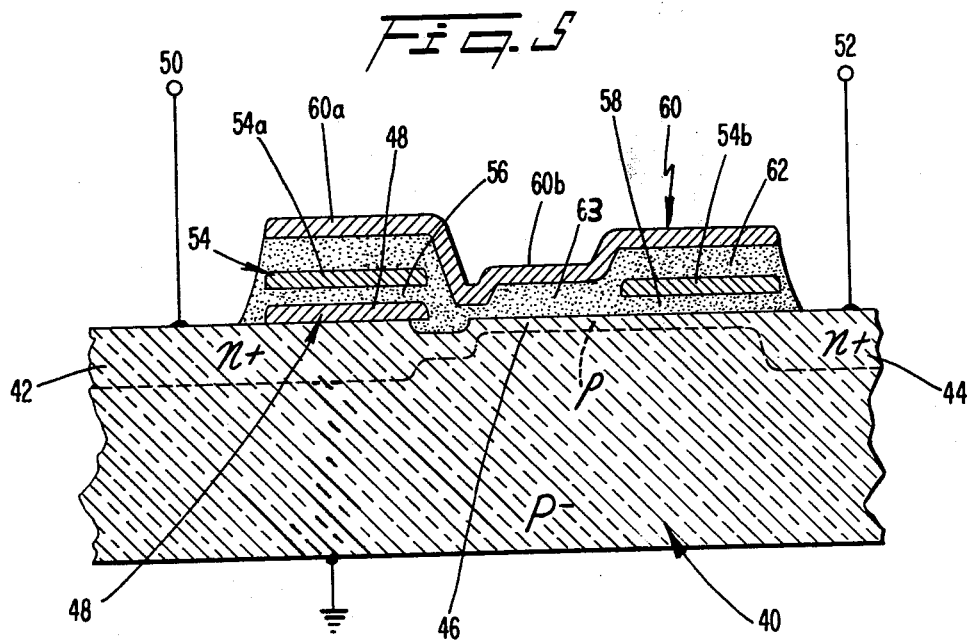
FIG. 5 is a sectional view of the cell of FIG. 4 along the line 5—5 of FIG. 4.

A device constructed in accordance with the invention is illustrated in FIGS. 4 and 5. A substrate of single crystal silicon 40 of p type conductivity has formed on its surface an n+ source region 42, an n+ drain region 44 and a p type channel region 46 which connects the source region and the drain region. A layer of polycrystalline silicon 48 is disposed on top of the source region 42 for reasons which will be explained hereinafter. The layer of polycrystalline silicon 48 is identified in the left hand portion of FIG. 4 by a relatively short dashed phantom line. A source terminal 50 and a drain terminal 52 are applied by conventional processing. A first portion 54a of a C shaped polycrystalline silicon floating gate 54 overlies the polycrystalline silicon layer 48. The floating gate 54 is identified in FIG. 4 by a long dashed phantom line. The first portion 54a is separated from the polycrystalline silicon layer by a layer of silicon dioxide 56 of 500–900 Å (Angstroms). A second portion 54b of the C shaped polycrystalline silicon floating gate 54 overlies part of the channel region 46. The second portion 54b influences the conduction of the channel region 46 in accordance with the electrical field produced by electrons stored on the floating gate 54. The second portion 54b is insulated from the channel region 46 by a silicon dioxide layer 58 of approximately 900 Å. A rectangular shaped polycrystalline silicon control gate 60 overlies the C shaped floating gate 54 and the channel region 46. The control gate 60 is identified in FIG. 4 by a solid line. The control gate 60 has a first portion 60a which overlies and is closely spaced from the floating gate 54 by a layer of silicon dioxide 62 of about 1500 Å and a second portion 60b which overlies the channel region 46. The channel region 46 is spaced from the second portion of the control gate 60b by a layer of silicon dioxide 63 of approximately 1000 Å. The control gate 60 has a third portion which does not overlie the channel region 46 that appears in the top portion of FIG. 4. The conventional control gate 60 terminal has been omitted from FIG. 5.

The present invention may be used in a random access array of cells by connecting the drain region 44 of each cell to a column line 64 (FIG. 4) and the control gate of each cell to a row line 66 (FIG. 4). Only the left hand edge of the column line 64 has been illustrated in FIG. 4. The forming of an array of EPROM cells is conventional and is not part of the invention. Any desired bit within an array of cells constructed in accordance with the invention may be randomly selected by activating a selected column line 64 and a selected row line 66. The phantom line 68 delineates the source region 42. The square 70 is a polycrystalline silicon contact which connects the row line 66 to the individual control gate 60 of each cell. The heavily dotted line 72 outlines the polycrystalline silicon to substrate contact opening which facilitates electrical connection between polycrystalline silicon 48 and the source region 42.

The EPROM cell of FIGS. 4 and 5 may be fabricated by a sequence of conventional process steps which are understood by persons skilled in the art. For example, thick silicon dioxide exceeding 10,000 Å in thickness is selectively grown on a body of p-conductivity semiconductor material with heavy boron doping underneath the thick oxide. This oxide in conjunction with the heavy boron doping will act as isolation of the source, drain and channel regions as outlined by the short dotted line between regions 64 and 68 in FIG. 4. Following this, a silicon dioxide layer of approximately 900 Å is disposed on the non-thick oxide area by conventional technique. A window in this thin oxide, outlined by the heavy dotted line 72 in FIG. 4, is etched open by photolithographic technique. This will facilitate electrical connection between the subsequently deposited polycrystalline silicon layer 48 and the source region 42. The polycrystalline silicon layer 48 is deposited, doped and shaped by well known conventional technique. Then part of the thin silicon dioxide is non-selectively removed by chemical etching and re-oxidized to 900 Å in thickness. During this thermal oxidation, silicon dioxide layers 58 and 56 are simultaneously formed. The region underneath 58 will then be boron doped by conventional photolithographic and ion implantation techniques to enhance the electrical writing efficiency of the structure. A second layer of polycrystalline silicon layer is then deposited, doped and photolithographically defined to form the floating gate 54. Following this, part of the thin silicone dioxide is again nonselectively etched away and re-oxidized to approximately 1000 Å in thickness in region 63. At the same oxidation step, the silicon dioxide layer 62 is also formed. A third layer of polycrystalline silicon is then deposited, doped and photolithographically defined to form the control gate 60. Subsequent to this, the well known conventional silicon gate technology will be applied to fabricate the source and drain regions 42 and 44, metal to control gate contact 70 and metal row line 66.

The cell of the present invention is programmed by two mechanisms which function to cause charge to accumulate on the floating gate 54. The first mechanism is the injection of "hot" electrons which acquire sufficient kinetic energy under the influence of an applied positive drain region 44 voltage relative to the source region 42 and an applied positive control gate 60 voltage relative to the source region 42 to surmount the potential energy barrier between floating gate 54 and the channel 46. The second mechanism is Fowler-Nordheim tunneling through the silicon dioxide layer 56 between the polycrystalline silicon layer 48 and the floating gate 54. A typical positive potential between the drain region 44 and source region 42 is 18 volts. A typical positive potential between the control gate 60 and the source region 42 is 25 volts.

The magnitude of Fowler-Nordheim tunneling current which flows through the silicon dioxide layer 56 between the polycrystalline layer 48 and the floating gate 54 during programming of the cell is enhanced by the property of polycrystalline silicon-silicon dioxide interface which sustains a higher magnitude of Fowler-Nordheim tunneling current flow than the Fowler-Nordheim tunneling current which flows between the polycrystalline silicon floating gate and the single crystal substrate that are separated by a silicon dioxide layer identical to layer 56.

The relative greater magnitude of Fowler-Nordheim tunneling current which flows between two layers of polycrystalline silicon which are separated by a silicon dioxide insulating layer when compared with the magnitude of Fowler-Nordheim tunneling current which flows between a polycrystalline silicon layer and a single crystal substrate separated by an identical insulation layer is described in Applied Physics Letters, Volume 27, No. 9, November 1, 1975, pp. 505 in an article entitled "Interface Effects and High Conductivity in Oxides Grown From Polycrystalline Silicon" by D. J. Di Maria and D. R. Kerr. The paper reports that the Fowler-Nordheim tunneling current through a silicon dioxide layer between a highly doped single crystal silicon and an aluminum metal electrode was enhanced by two to three orders of magnitude when a layer of polycrystalline silicon was disposed on the surface of the highly doped single crystal silicon.

The greater magnitude of Fowler-Nordheim tunneling current in the cell of the present invention which flows through the silicon dioxide layer 56 disposed between the floating gate 54 and the polycrystalline silicon layer 48 permits a lower field strength or a shorter charging interval for a given electrical field to be used in the charging of the floating gate 54 than that which is required by the prior art device of FIGS. 1-3 which has a lower magnitude of Fowler-Nordheim tunneling current flow between the relatively highly doped source 14 and the floating gate 20.

An EPROM in accordance with the present invention is erased by a single mechanism which removes charge stored on the floating gate 54 during programming by Fowler-Nordheim tunneling current flow through the silicon dioxide layer 56 between the polycrystalline silicon floating gate 54 and the polycrystalline silicon layer 48. The application of a positive voltage of 25 volts to the source region 42 with respect to the control gate 60 causes Fowler-Nordheim tunneling of the electrons stored on the polycrystalline silicon floating gate 54 through the silicon dioxide 56 to the polycrystalline layer 48. The relative two to three order of magnitude increase in Fowler-Nordheim tunneling current flow between the floating gate 56 and the relatively highly doped source region 44 which is caused by the polycrystalline silicon layer 48 disposed on the surface of the source region 42 decreases the time required for erasure of the stored charge on the floating gate 54 to occur for a given electrical field. A lower voltage could alternatively be used to cause the same magnitude of Fowler-Nordheim tunneling current to flow for the same period of erasing time that was required to discharge the prior art device of FIGS. 1-3.

Therefore, a lower erasure voltage or shorter erasure time is required to charge and discharge a device in accordance with the present invention than the prior art device of FIGS. 1-3.

The increased Fowler-Nordheim tunneling current of the present invention which flows between the polycrystalline silicon layer 48 that is disposed on the surface of the source region 42 between the floating gate 54 and the source region may be the result of the localized properties of the polycrystalline silicon-silicon dioxide interface in accordance with a theory postulated in the aforementioned Applied Physics Letters paper.

In accordance with the invention, the polycrystalline silicon layer 48 may alternatively be located in conductive contact with surface of the drain region 44 instead of the source region 42. In this configuration the location of the floating gate 54 would be moved so that a portion of the floating gate overlies the polycrystalline silicon layer which is in conductive contact with the drain region 44.

Moreover, the portion of the control gate 60b which overlies the channel 46 may be eliminated if the erasure condition is carefully controlled to prevent the accumulation of a positive charge on the floating gate 54 after erasing which would convert the MOS structure from an enhancement to a depletion mode of operation.

Other materials might be used to insulate the polycrystalline layer 48 from the floating gate 54 such as silicone nitride.

The floating gate 54 may be replaced with a conductive layer since the replacement of the polycrystalline silicon floating gate 54 would not interfere with the localized properties of the polycrystalline silicon 48 silicon dioxide 56 interface.

What is claimed is:

1. A floating gate storage cell comprising:
   (a) a body of semiconductor material having a substrate of a first conductivity type, a source region and a drain region each of a second conductivity type and a channel region of the first conductivity type connecting the source region and the drain region,
   (b) a polycrystalline silicon layer conductively connected to either the source region or the drain region,
   (c) a conductive floating gate insulated from the source region, drain region, channel region, and from the polycrystalline silicon layer, the floating gate having a first portion overlying the channel region to influence the conductivity of the channel region in accordance with charge stored thereon and a second portion overlying and insulated from the polycrystalline silicon layer to allow Fowler-Nordheim tunneling current between the polycrystalline silicon layer and the floating gate,
   (d) and a control gate insulated from the floating gate, the source region, drain region and the channel region, the control gate having a first portion overlying the first portion of the floating gate to influence the conductivity of the channel in response to any potential applied to the control gate.

2. A floating gate storage cell in accordance with claim 1 wherein the control gate has a second portion which overlies a portion of the channel region which is not overlied by the floating gate.

3. A floating gate storage cell in accordance with claim 1 wherein the floating gate is insulated from the source region, drain region and channel region by a layer of silicon dioxide.

4. A floating gate storage cell in accordance with claim 3 wherein the control gate has a second portion which overlies a portion of the channel region which is not overlied by the floating gate.

5. A floating gate storage cell in accordance with claim 4 wherein the substrate is p-conductivity type, the source region and drain region are each n+ conductivity type, the floating gate is polycrystalline silicon and the control gate is polycrystalline silicon.

6. A floating gate storage cell in accordance with claim 4 wherein the control gate and the floating gate are each polycrystalline silicon.

7. A floating gate storage cell in accordance with claim 4 wherein the control gate is insulated from the floating gate by a layer of silicon dioxide.

8. A storage cell in accordance with claim 1 wherein the floating gate is insulated from the source region, drain region and channel region by a layer of silicon nitride.

9. A storage cell in accordance with claim 4 wherein the second portion of the floating gate is insulated from the polycrystalline silicon layer by a layer of silicon dioxide between 500 and 900 Å; the insulation between the first portion of the control gate and the floating gate is a layer of silicon dioxide of approximately 1500 Å, the insulation between the second portion of the control gate and the channel region is a layer of silicon dioxide of approximately 1000 Å and the layer of insulation between the first portion of the floating gate and the channel region is a layer of silicon dioxide of approximately 900 Å.

10. A storage cell in accordance with claim 3, wherein the control gate is polycrystalline silicon.

11. A storage cell in accordance with claim 10, wherein the control gate is polycrystalline silicon.

12. A storage cell in accordance with claim 4, wherein the polycrystalline silicon layer is rectangular in shape and overlies the source region; the floating gate is C shaped; and the control gate is rectangular in shape.

13. A storage cell in accordance with claim 11 wherein the floating gate has a third portion which connects the first and second portions, and the third portion does not overlie the channel.

* * * * *